United States Patent [19]

Malm

[11] 4,385,321
[45] May 24, 1983

[54] CORRELATED TRIPLE SAMPLING CIRCUIT

[75] Inventor: Robert Malm, Pacific Palisades, Calif.

[73] Assignee: Northrop Corporation, Los Angeles, Calif.

[21] Appl. No.: 298,781

[22] Filed: Sep. 2, 1981

Related U.S. Application Data

[63] Continuation-in-part of Ser. No. 207,478, Nov. 14, 1980, Pat. No. 4,338,633.

[51] Int. Cl.³ .............................................. H04N 3/14
[52] U.S. Cl. ..................................... 358/213; 358/167
[58] Field of Search ............... 358/209, 213, 166, 167; 250/211 R, 211 J, 578; 357/24, 30

[56] References Cited

U.S. PATENT DOCUMENTS

| | | | |
|---|---|---|---|
| 4,079,422 | 3/1978 | Anagnostopoulos | 358/213 |
| 4,238,742 | 8/1981 | Izumita | 358/213 |
| 4,316,221 | 2/1982 | Swab | 358/213 |
| 4,317,134 | 2/1982 | Woo | 358/213 |
| 4,336,557 | 6/1982 | Koch | 358/213 |
| 4,338,633 | 7/1982 | Malm | 358/213 |

Primary Examiner—Michael A. Masinick
Attorney, Agent, or Firm—Edward A. Sokolski

[57] ABSTRACT

A device for cyclically sampling the output voltage of a column of electrodes in a two-dimensional array of radiation detectors. The device samples the column voltage three times within a cycle and combines these samples in a manner which cancels out any linear change in column voltage with time during the cycle and obtains a measure of the voltage change due to charge transfer from a selected electrode in the column to an adjacent row electrode.

4 Claims, 14 Drawing Figures

CORRELATED TRIPLE SAMPLING CIRCUIT

This specification is a continuation-in-part of patent application No. 207,478, filed Nov. 14, 1980, for an invention titled "FRAME INTEGRATOR FOR CID IMAGING SYSTEM," and invented by Robert Malm; now U.S. Pat. No. 4,338,633, July 6, 1982.

BACKGROUND OF THE INVENTION

1. Field of the Invention

This invention pertains to semiconductor radiation detectors. More particularly, this invention pertains to circuits for reading the outputs from elements in a two-dimensional array of semiconductor, radiation detectors. The charge injection device (CID) technique for reading the output of such arrays is described in U.S. Pat. No. 4,079,422 and by Burke and Michon, "Charge Injection Imaging: Operating Techniques and Performances Characteristics," *IEEE Journal of Solid-State Circuits*, pp. 121-128, vol. SC-11, No. 1, Feb. 1976, and in the parent application referred to above.

2. Description of the Prior Art

U.S. Pat. No. 4,338,633 referred to above describes a method for "reading" the output from each element of a two-dimensional array of semiconductor, radiation detectors and integrating this output. The output of a particular element in the array is read by measuring the voltage output from it associated column conductor when the voltage on the row conductor connected to the adjacent row element is altered so as to cause the charge collected under the column electrode to transfer to the adjacent row electrode.

In the read-out procedure described in the parent application, an interval at the end of each charge collection period was used to "read out" each of the elements in the array of radiation detectors by measuring the changes in the output voltages of the column conductors as the voltage on each of the row conductors was altered. Normally the column voltage varies linearly with time during the read-out process as radiation-generated charge continues to collect under the column electrodes. In many cases, this linear variation is small compared to the discrete voltage change that occurs when charge transfer takes place. In other cases, the linear variation of column voltage cannot be ignored.

SUMMARY OF THE INVENTION

This invention is a circuit which samples the output voltage of a column conductor at different times during the read-out cycle for a particular element and combines these samples in a manner which cancels out the linear change with time of the column conductor voltage leaving only the change in voltage due to charge transfer from the element being read out during the cycle. The samples are spaced in time at preselected time intervals and are combined in sign and magnitude so as to cancel out any linear change of voltage with time.

DESCRIPTION OF THE PREFERRED EMBODIMENT

Two embodiments of the invention are described in this specification. The two embodiments differ in that the time intervals between the samplings of the column conductor voltage, and the relative values of certain components in the circuitry which combines the samples, are different.

Figure 1:
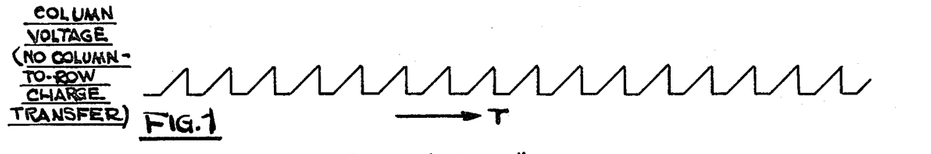
FIG. 1 illustrates the manner in which the voltage of a column conductor varies with time.
Figure 2:
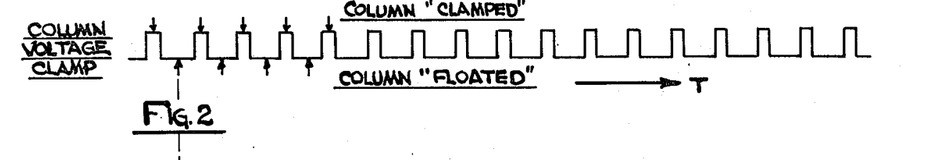
FIG. 2 illustrates the variation of column clamping voltage with time.
Figure 3:
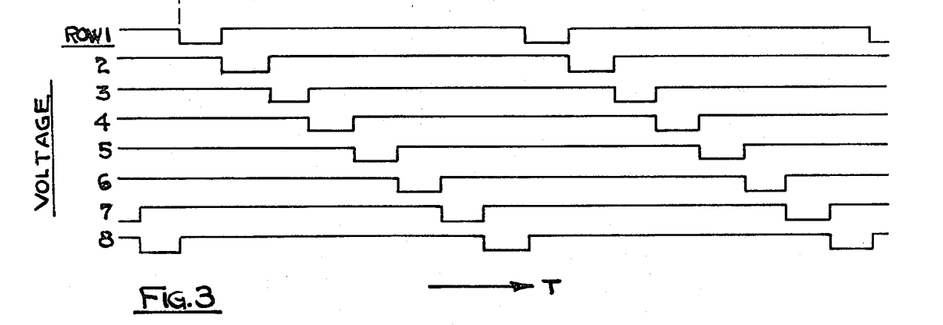
FIG. 3 illustrates the sequence in which voltages are applied to row conductors.
Figure 4:
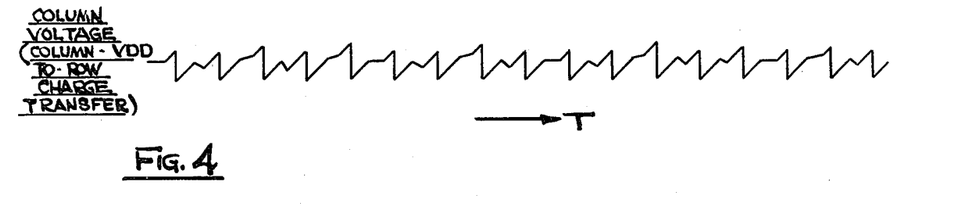
FIG. 4 illustrates the manner in which the voltage of a column conductor varies with time when charge is transferred to an adjacent row element.
Figure 5:
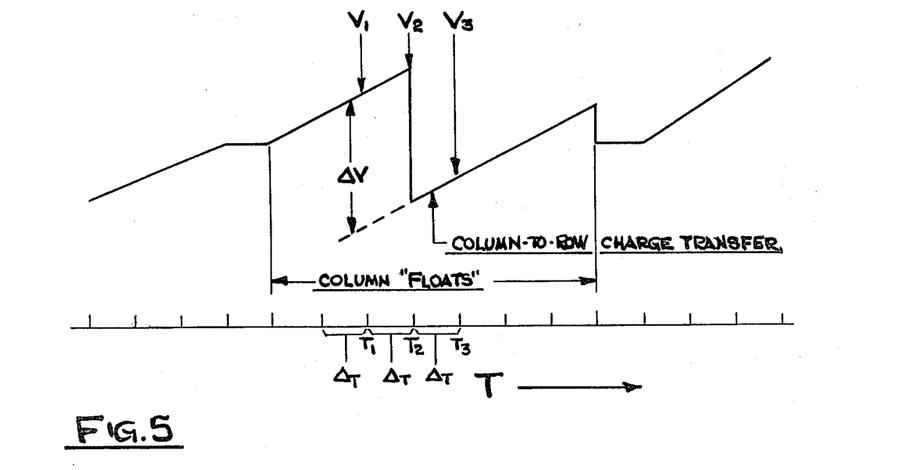
FIG. 5 illustrates in more detail how the column conductor voltage varies with time during a single measurement cycle.

As indicated above, charge collection continues during the read-out of a two-dimensional array of radiation detectors, such as that described in the parent application, and the output voltage of each column conductor will increase at an approximately linear rate with time due to continuing charge collection at the various detector elements on the conductor. An additional change in voltage will be caused by charge transfer when the voltage on a particular row conductor is altered. FIG. 1 indicates the linear or approximately linear change in voltage with time for a column conductor to which the clamping voltage shown in FIG. 2 is applied. If the row conductor voltages are altered in the manner shown in FIG. 3, then the voltage output from the column conductor will have superimposed on it a change in voltage as shown in FIG. 4 due to the charge transfer from the element in the column conductor that is adjacent to the element on the row conductor for which the row conductor voltage is altered. FIG. 5 shows the voltage change on a column conductor during one period between the times at which the column voltage is "clamped". This invention samples the column voltage during three substantially equal intervals of $\Delta T$ in length ending at times $T_1$, $T_2$ and $T_3$ in order to obtain sample voltages $V_1$, $V_2$ and $V_3$. Because of the characteristics of the sampling circuit the voltages obtained by sampling are not exactly equal to the column voltage at the end of the sampling period, but are approximately proportional to the column voltage at the end of each sampling period.

From FIG. 5, it can be seen that the change in voltage $\Delta V$ caused by the shift in charge between the column element and the adjacent row element is given by the following:

$$\Delta V = V_3 - 2V_2 + V_1 \quad (1)$$

The circuitry of the first embodiment of this invention samples the output voltage of the column conductor during three short time intervals ending at $T_1$, $T_2$ and $T_3$ and combines voltages $V_1$, $V_2$, and $V_3$ obtained by these samples in the proportions given by Equation (1) to obtain $\Delta V$.

Figure 6:
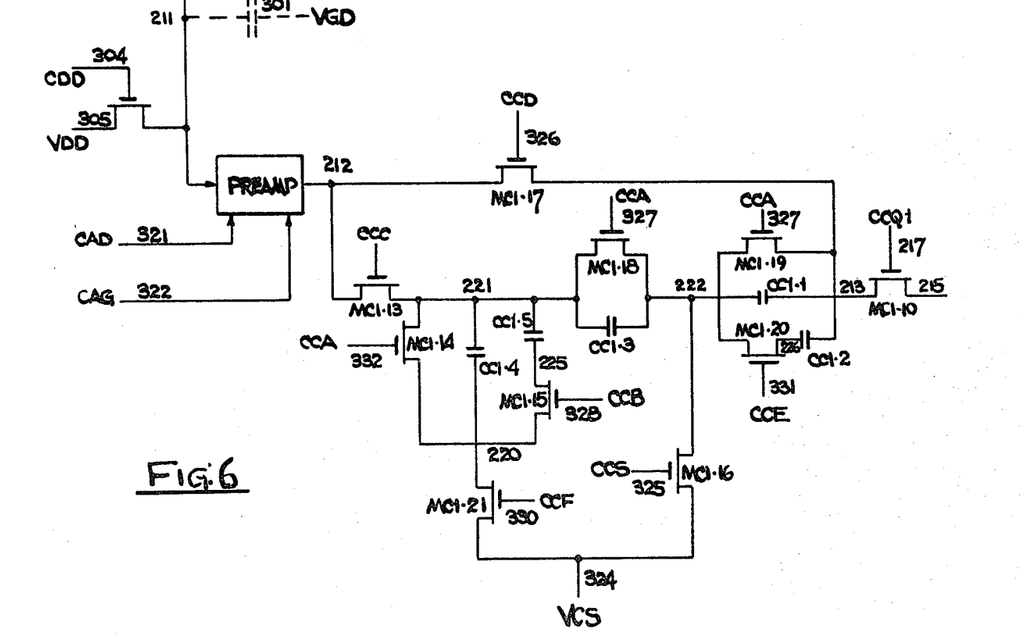
FIG. 6 is a schematic diagram of a first embodiment of this invention.

FIG. 6 is a schematic diagram of the first embodiment of the invention. For a two-dimensional array of radiation detectors, the circuitry shown in FIG. 6 is repeated for each column conductor. If the circuit in FIG. 6 were used in connection with the circuit shown in FIG. 4A of the parent application, node 212 in FIG. 6 of this specification would be connected to the junction between MC1-7 and MC1-8 in FIG. 4A of the parent application and transistor MC1-10 in FIG. 6 of this specification would replace the transistor labelled MC1-10 in FIG. 4A of the parent application. The control voltage, labelled CCQ1 in FIG. 6, corresponds to the control voltage labelled CCP1 shown in FIG. 4A in the parent application. The preamp shown to the left of node 212 in FIG. 6 and related circuitry to the left of the preamp represents the circuitry in FIG. 4A connecting the column conductor 1 to the junction between MC1-7 and MC1-8 in FIG. 4A of the parent application.

Figure 7:
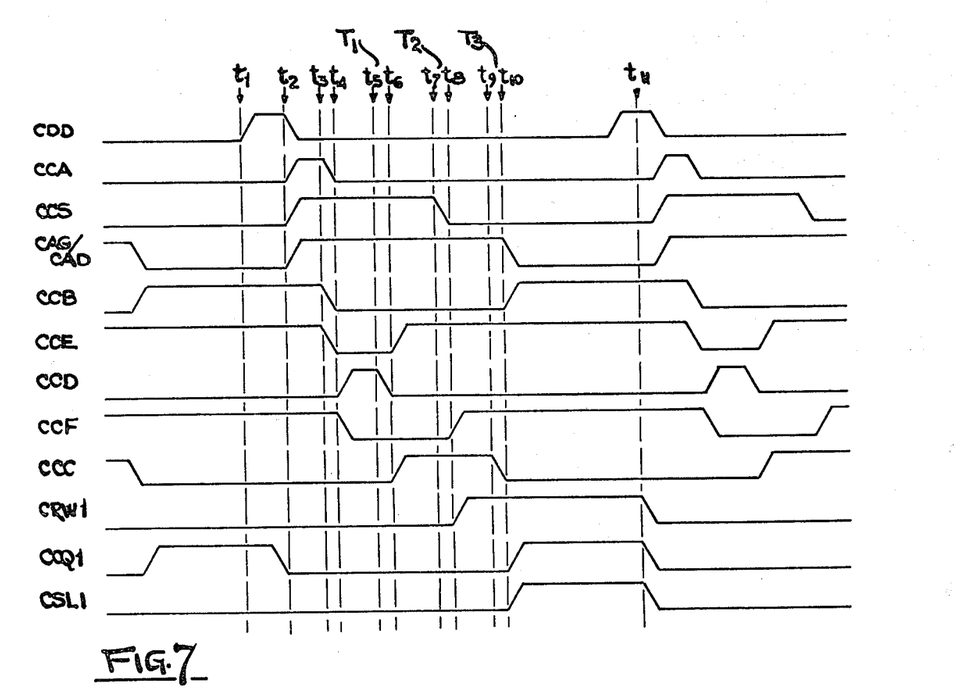
FIG. 7 is a timing diagram.

FIG. 7 is a timing diagram which shows the control voltages applied to the circuitry in FIG. 6 as a function of time. CSL1 in FIG. 7 is the same as CSL1 in FIG. 5 of the parent application, although the time base has been shifted between the two figures. CCQ1 corresponds to $\overline{CCP1}$ in FIG. 5 of the parent application. CRW1 in FIG. 7 corresponds with CRW1 in FIG. 5 of the parent application. The subscripts "1" refer to column 1 and row 1, respectively, of the column and row conductors that interconnect the elements in the two-dimensional array of radiation detectors.

In FIG. 7, timing points are indicated by lower-case t's with numerical subscripts and the times at which the voltage samples are obtained are indicated by upper case T's with numerical subscripts. Table I describes the sequence of events for the sampling circuit. The circuit for obtaining the three samples and for combining the three samples in accordance with Equation (1) is shown in FIG. 6. The MOSFET control waveforms are given in FIG. 7 (n-channel devices are assumed). An understanding of the operation of the circuit can be obtained by studying the sequence of events listed in Table I and the following explanation.

The voltage V(213) at node 213 is given by the expression $$V(213) = [V(213) - V(222)] + [V(222) - V(221)] + \quad (2)$$

$$[V(221) - V(324)] + VCS$$

Now at time $t_{10}$, $$\left. \begin{array}{l} V(213) - V(222) = (V_1 - VCS)/2 \\ V(222) - V(221) = -(V_2 - VCS) \\ V(221) - V(324) = (V_3 - VCS)/2 \end{array} \right\} \quad (3)$$

Thus, $$V(213) = V_1/2 - V_2 + V_3/2 + VCS \quad (4)$$

or $$V(213) = \Delta V/2 + VCS \quad (5)$$

The voltage at node 213 is equal to one-half the column voltage change that results when column-to-row charge transfer takes place plus a bias voltage VCS which permits the node voltage to be adjusted in level to meet the requirements of subsequent circuits.

Figure 8:
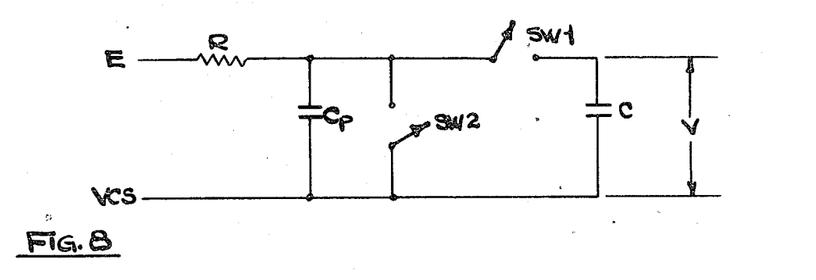
FIG. 8 is the schematic of an equivalent circuit for a portion of the first and second embodiments.
Figure 9:
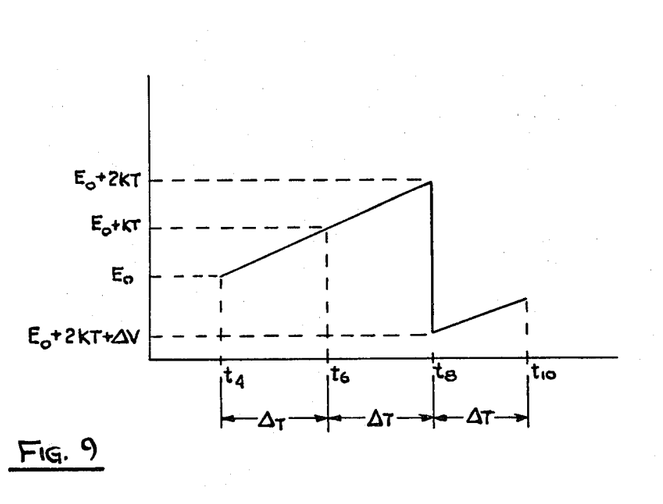
FIG. 9 is another illustration of the variation of column conductor voltage with time.

A more rigorous mathematical analysis of the circuit shown in FIG. 6 substantiates the results given in the previous section. At any particular instant, the circuit of FIG. 6 is equivalent to the simplified circuit shown in FIG. 8 where E is the preamplifier output voltage, R is the preamplifier output impedance, $C_p$ is the preamplifier output capacitance, and C is the load capacitance. The variation of E with time is shown in FIG. 9. For a definition of the times $t_4$, $t_6$, $t_8$, and $t_{10}$ in terms of the MOSFET control signals, see FIG. 7.

During the time interval from $t_4$ to $t_6$, the active capacitor in the circuit of FIG. 6 is CC1-1 which has a value C. The capacitor voltage V(CC1-1) at time $t_6$, is given by the expression $$V(CC1\text{-}1) = (E_o - VCS)\left(1 - e^{-\frac{T}{R(C+C_p)}}\right) + \quad (7)$$

$$KR(C + C_p)\left(e^{-\frac{T}{R(C+C_p)}} + T/R(C + C_p) - 1\right)$$

During the time period from $t_8$ to $t_{10}$, the active capacitor is CC1-4 which also has a value C. The capacitor voltage V(CC1-4) at time $t_{10}$ is given by the expression $$V(CC1\text{-}4) = (E_o + 2KT + \quad (8)$$

$$\Delta V - VCS)\left(1 - e^{-\frac{T}{R(C+C_p)}} + T/R(C + C_p) - 1\right)$$

When MOSFETS MC1-20 and MC1-15 turn on, the voltage across CC1-1 and CC1-4 are halved (because in this embodiment the capacitances of CC1-1 and CC1-2 are the same as are those of CC1-4 and CC1-5). The voltage at node 213 becomes $$V(213) = \frac{V(CC1\text{-}1)}{2} - V(CC1\text{-}3) + \frac{V(CC1\text{-}4)}{2} + VCS \quad (9)$$

Substituting Equations (6), (7) and (8), we obtain $$V(213) = \frac{\Delta V}{2}\left(1 - e^{-\frac{T}{R(C+C_p)}}\right) + VCS \quad (10)$$

Figure 10:
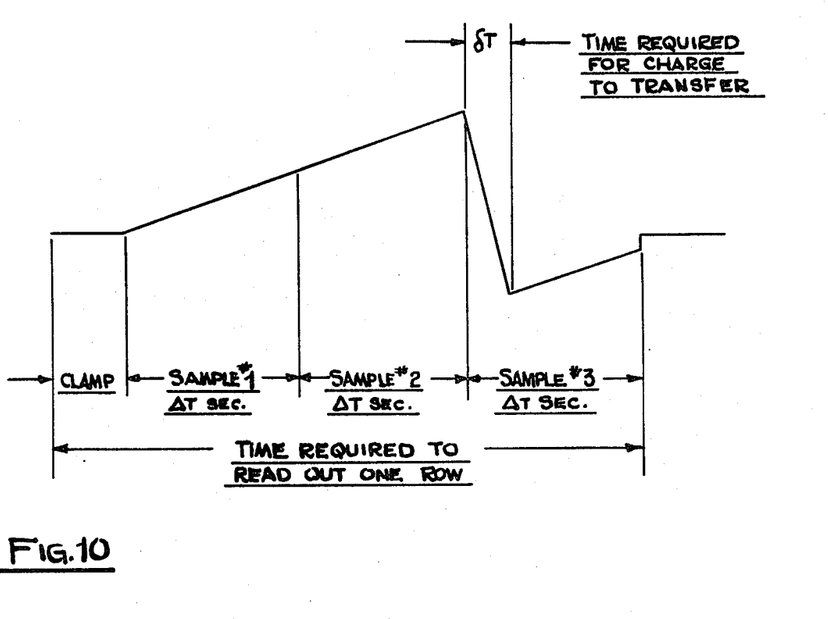
FIG. 10 illustrates the relationships between the charge transfer period and the sampling intervals for the first embodiment.

Equation (1) approximates Equation (5) when T/RC is much greater than one. For best signal-to-noise, however, T/RC should have a value comparable to one, in which case there is some loss in signal level in passing through the capacitor network. The accurate operation of the first embodiment requires that the decrease in column voltage due to charge transfer must occur in a period of time that is short compared to the sampling time period. As illustrated in FIG. 10, $\delta t$ should be much less than $\Delta T$.

Figure 11:
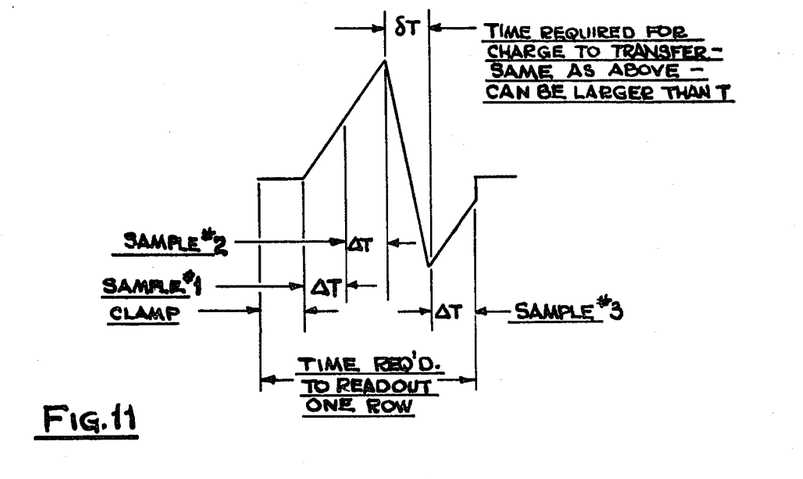
FIG. 11 illustrates the relationships between the charge transfer period and the sampling intervals for the second embodiment.

In the second embodiment, the sampling periods are not all contiguous. As illustrated in FIG. 11, the sampling periods are shifted so that the voltage change due to charge transfer does not occur during a sampling period. In the illustration, the charge transfer occurs between the second and third sampling period, although the charge transfer could also be arranged to occur between the first and second sampling periods. In the first embodiment, $\delta T$, the charge transfer period, had to be much shorter than $\Delta T$, the sampling period, or conversely $\Delta T$ had to be much greater in length than $\delta T$. In the second embodiment, because the voltage change due to charge transfer does not occur during a sampling interval, $\Delta T$ need not be large compared to $\delta T$. As a consequence, $\Delta T$ can be smaller, and the read out period in the second embodiment can be shorter.

Figure 12:
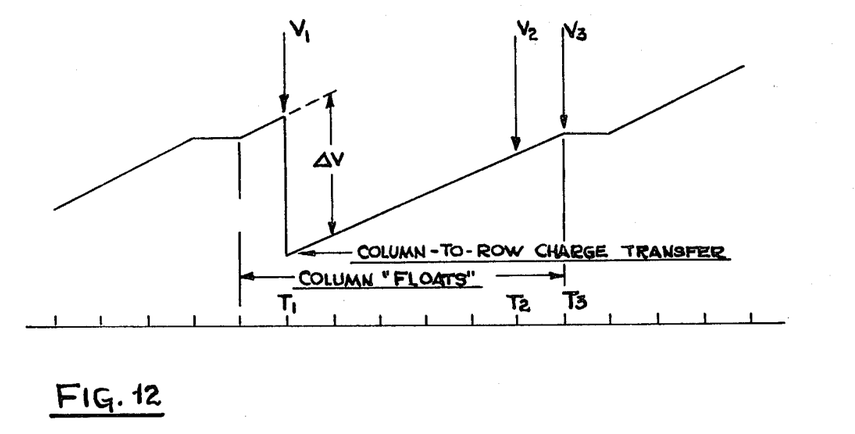
FIG. 12 illustrates the points in time at which the conductor voltage is sampled in the second embodiment of the invention.

In the second embodiment of the invention, the interval in time between $T_1$ and $T_2$ and the interval in time between $T_2$ and $T_3$ are not equal. By moving the points in time at which the conductor voltage is sampled nearer to the beginning and the end of the period during which the column conductor is floated, the sampling rate for the elements in the array can be increased as discussed above. FIG. 12 illustrates the points in time, during the interval in which the column conductor voltage is floated, that the voltage samples $V_1$, $V_2$ and $V_3$ are obtained by the circuitry. More accurately, the indicated times are the times at which the short sampling intervals (of $\Delta T$ in length) terminate.

Figure 13:
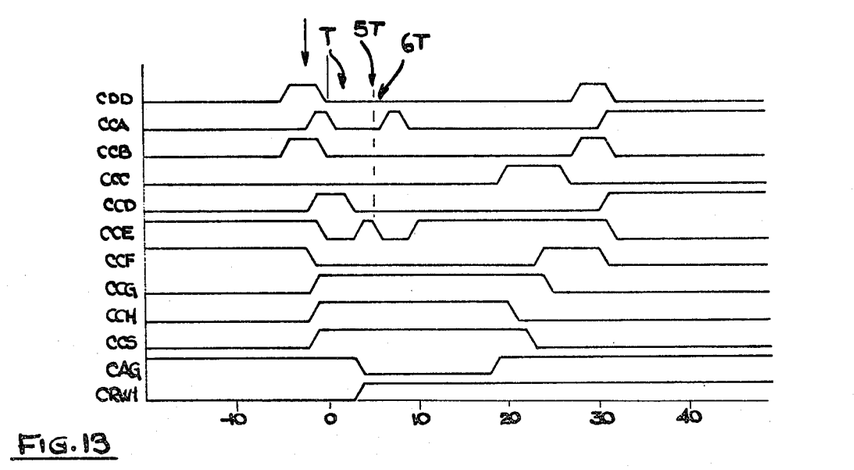
FIG. 13 is a timing diagram for the second embodiment of the invention.
Figure 14:
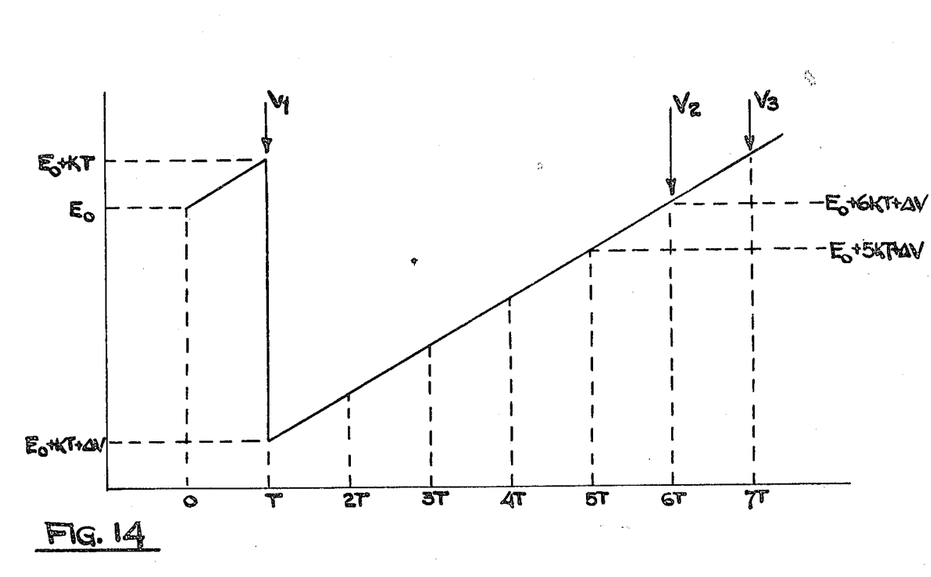
FIG. 14 illustrates the variation with time of the column conductor voltage in the second embodiment.

The circuitry of the second embodiment of the invention is the same as that shown in FIG. 6, although the relative sizes of certain of the capacitors are altered from that of the first embodiment, as indicated below. FIG. 13 is a timing diagram for the control voltages applied to the circuitry and Table II describes the sequence of events for the sampling circuit.

The procedure for measuring the column voltage change $\Delta V$ when a column-to-row charge transfer takes place is illustrated in FIG. 12. From the drawing, it can be seen that $$\Delta V = -V_1 + 6V_2 - 5V_3 \qquad (11)$$

where $V_1$, $V_2$, and $V_3$ are sampled values of the column voltage.

Note that there is an allowance of four sample periods for the charge transfer operation to be accomplished.

The circuit for obtaining the three samples and combining the three samples in accordance with (11) is shown in FIG. 6. The MOSFET control waveforms are given in FIG. 13. An understanding of the operation of the circuit can be obtained by studying the sequence of events listed in Table II.

The voltage V(213) at node 212 is given by the expression $$V(213) = [V(213) - V(222)] + [V(222) - V(221)] + \qquad (12)$$
$$[V(221) - V(324)] + VCS$$

Now at time t=30, $$\left.\begin{array}{l} V(213) - V(222) = (V_1 - VCS)/6 \\ V(222) - V(221) = -(V_2 - VCS) \\ V(221) - V(324) = 5(V_3 - VCS)/6 \end{array}\right\} \quad (13)$$

Thus, $$V(213) = V_1/6 - V_2 + 5V_3/6 + VCS \qquad (14)$$

or $$V(213) = -\Delta V/6 + VCS \qquad (15)$$

The voltage at node 213 is equal to a negative one-sixth times the column voltage change that results when column-to-row charge transfer takes place, plus a bias voltage VCS which permits the node voltage to be adjusted in level to meet the requirements of subsequent circuits.

A more rigorous mathematical analysis of the circuit shown in FIG. 6 substantiates the results given in the previous section. At any particular instant, the circuit of FIG. 6 is equivalent to the simplified circuit shown in FIG. 8 where E is the preamplifier output voltage, R is the preamplifier output impedance, $C_P$ is the preamplifier output capacitance, and C is the load capacitance. The variation of E with time is shown in FIG. 12. The time interval T is equivalent to four units of time on the scale given in FIG. 13. During the time interval from 0 to T, the active capacitor in the circuit of FIG. 6 is CC1-1 which has a value C. The capacitor voltage V(CC1-1) at time T, is given by the expression $$V(CC1\text{-}1) = (E_o - VCS)\left(1 - e^{-\frac{T}{R(C+C_p)}}\right) + \qquad (16)$$

$$KR(C + C_p)\left(e^{-\frac{T}{R(C+C_p)}} + T/R(C + C_p) - 1\right)$$

During the time interval from 5T to 6T, the active capacitor is CC1-3 which also has a value C. The capacitor voltage V(CC1-3) at time 6T is given by the expression $$V(CC1\text{-}3) = \qquad (17)$$

$$(E_o + 5KT + \Delta V - VCS)\left(1 - e^{-\frac{T}{R(C+C_p)}}\right) +$$

$$KR(C + C_p)\left(e^{-\frac{T}{R(C+C_p)}} + T/R(C + C_p) - 1\right)$$

During the time period from 6T to 7T, the active capacitor is CC1-4 which also has a value C. The capacitor voltage V(CC1-4) at time 7T is given by the expression $$V(CC1\text{-}4) = \qquad (18)$$

$$(E_o + 6KT + \Delta V - VCS)\left(1 - e^{-\frac{T}{R(C+C_p)}}\right) +$$

$$KR(C + C_p)\left(e^{-\frac{T}{R(C+C_p)}} + T/R(C + C_p) - 1\right)$$

When MC1-20 turns on at t=3 (see FIG. 13), the voltage across CC1-1 is reduced by the factor $$\frac{CC1\text{-}1}{CC1\text{-}1 + CC1\text{-}2}$$

When MC1-20 turns off (t=5) and MC1-9 turns on (t=6), CC1-1 is discharged. When MC1-19 turns off (t=8) and MC1-20 turns on (t=9), the voltage across CC1-2 is reduced by the factor $$\frac{CC1\text{-}2}{CC1\text{-}1 + CC1\text{-}2} \tag{5}$$

The voltage across CC1-1 is reduced by the product of these two factors which is 1/6 if CC1-1=2 pF and CC1-2=0.5359 pF. Thus, $$V(CC1\text{-}1) = \frac{1}{6}(E_o - VCS)\left(1 - e^{-\frac{T}{R(C+C_p)}}\right) + \tag{19}$$

$$\frac{1}{6} KR(C + C_p)\left(e^{-\frac{R}{R(C+C_p)}} + T/R(C + C_p) - 1\right)$$

The voltage across CC1-4 is similarly reduced when MC1-15 turns on (t=27) by the factor $$\frac{CC1\text{-}4}{CC1\text{-}4 + CC1\text{-}5}$$

which is equal to 5/6 if CC1-4=2 pF and CC1-5=0.4 pF. Thus, $$V(CC1\text{-}4) = \tag{20}$$

$$\frac{5}{6}(E_o + 6KT + \Delta V - VCS)\left(1 - e^{-\frac{T}{R(C+C_p)}}\right) +$$

-continued $$\frac{5}{6} KR(C + C_p)\left(-e^{-\frac{T}{R(C+C_p)}} + T/R(C + C_p) - 1\right)$$

The voltage at node 213 when t>27 is given by the expression $$V(213) = V(CC1\text{-}1) - V\text{-}(CC1\text{-}3) + V(CC1\text{-}4) + VCS \tag{21}$$

where V(CC1-1) is given by Equation (19), V(CC1-3) by (7) and V(CC1-4) by Equation (20). Making these substitutions, we obtain $$V(213) = -\frac{\Delta V}{6}\left(1 - e^{-\frac{T}{R(C+C_p)}}\right) + VCS \tag{22}$$

Equation (22) approximates equation (15) when $T/R(C+C_p)$ is much greater than one. For best signal-to-noise, however, $T/R(C+C_p)$ should have a value comparable to one.

From the preceding description of the first and second embodiments, it is apparent that the circuitry and the sampling technique can be adapted to any of a number of different time intervals between the first, second and third sampling periods and that the size of the capacitors can be adjusted to combine the sampled voltages so as to produce an output voltage that is dependent upon the change in column conductor voltage that is due to the charge transferred from a selected element in the column to the adjacent row element and that is independent of the approximately linear increase of conductor voltage with a time due to charge collection occurring at other elements of the column.

TABLE I

| SAMPLING CIRCUIT SEQUENCE OF EVENTS | | |
|---|---|---|
| TIME | EVENT | RESULT |
| $t_1$ | CDD goes high | Column is clamped to deep depletion voltage VDD. |
| $t_2$ | CDD goes low | Column is "floated". |
|  | CCA goes high | CC1-1, CC1-2, CC1-3, CC1-4, CC1-5 shorted. |
|  | CCS goes high | CC1-1 connected to VCS |
|  | CAG/CAD go high | Preamplifier turned on. |
| $t_3$ | CCA goes low | CC1-1, CC1-2, CC1-3, CC1-4, CC1-5 unshorted. |
|  | CCB goes low | CC1-5 disconnected. |
|  | CCE goes low | CC1-2 disconnected. |
| $t_4$ | CCF goes low | CC1-4 disconnected from VCS. |
|  | CCD goes high | CC1-1 connected to Preamplifier. |
| $t_4$-$t_5$ | — | CC1-1 charges up to $V_1$ − VCS. |
| $t_5$ | CCD goes low | CC1-1 disconnected from Preamplifier. |
| $t_6$ | CCC goes high | CC1-3 and CC1-4 connected to Preamplifier. |
|  | CCE goes high | CC1-2 connected across CC1-1 thereby reducing voltage across CC1-1 by one half. |
| $t_6$-$t_7$ | — | CC1-3 charges up to $V_2$ − VCS. |
| $t_7$ | CCS goes low | CC1-3 disconnected from VCS. |
| $t_8$ | CCF goes high | CC1-4 connected to VCS. |
|  | CRW1 goes high | Deep depletion voltage applied to row #1 electrodes thereby causing column-to-row charge transfers. |
| $t_8$-$t_9$ | — | CC1-4 charges up to $V_3$ − VCS. |
| $t_9$ | CCC goes low | Capacitor network disconnected from Preamplifier. |
| $t_{10}$ | CCB goes high | CC1-5 connected across CC1-4 thereby reducing voltage across CC1-4 by one half. |
|  | CAG/CAD goes low | Preamplifier turned off. |
|  | CCQ1 goes high | Capacitor network connected to gates of column #1 integrating capacitor current sources. |
|  | CSL1 goes high | Row #1 current sources turned on. |
| $t_{11}$ | CCQ1 goes low | Capacitor network disconnected from current sources. |
|  | CRW1 goes low | Flatband voltage applied to row #1 electrodes. |
|  | CSL1 goes low | Current sources turned off. |

TABLE II

SAMPLING CIRCUIT SEQUENCE OF EVENTS

| TIME | EVENT | RESULT |
|---|---|---|
| −5 | CDD goes high | Column is clamped to deep depletion voltage VDD. |
| −2 | CCA goes high | CC1-1 and CC1-2 shorted. |
|  | CCD goes high | Preamp output clamped to VCS. |
|  | CCF goes low | CC1-4 and CC1-5 disconnected from VCS. |
|  | CCG goes high | CC1-4 and CC1-5 shorted. |
|  | CCH goes high | CC1-3 shorted. |
|  | CCS goes high | CC1-1 connected to VCS. |
| −1 | CDD goes low | Column is "floated". |
|  | CCB goes low | CC1-5 disconnected from CC1-4. |
|  | CCE goes low | CC1-2 disconnected from CC1-1. |
| 0 | CCA goes low | CC1-1 unshorted. |
| 0−2 | — | CC1-1 charges to $V_1$ − VCS. |
| 2 | CCD goes low | CC1-1 Disconnected from Preamp. |
| 3 | CCE goes high | CC1-2 bridged across CC1-1. |
|  | CAG goes low | Preamp turned off. |
|  | CRW1 goes high | Deep depletion voltage applied to row #1 electrodes thereby causing column-to-row charge transfer |
| 5 | CCE goes low | CC1-2 disconnected from CC1-1. |
| 6 | CCA goes high | CC1-1 shorted. |
| 8 | CCA goes low | CC1-1 unshorted. |
| 9 | CCE goes high | CC1-2 bridged across CC1-1. |
| 18 | CAG goes high | Preamp turned on. |
| 19 | CCC goes high | Preamp output clamped to VCS. |
| 20 | CCH goes low | CC1-3 unshorted. |
| 20−22 | — | CC1-3 charges to $V_2$ − VCS. |
| 22 | CCS goes low | CC1-3 disconnected from VCS. |
| 23 | CCF goes high | Preamp output clamped to VCS. |
| 24 | CCG goes low | CC1-4 unshorted. |

I claim:

1. A device for cyclically sampling the output voltage of a column conductor connecting a column of electrodes in a two-dimensional array of radiation detectors to separate the change in output voltage, due to charge transfer from a selected electrode in the column to an adjacent row electrode, from the change in voltage due to charge accumulation near the other electrodes in the same column comprising:

(a) first sampling means for sampling the output voltage of the column conductor during a first sampling period of time ending at $T_1$ within the cycle, (b) second sampling means for sampling the output voltage of the column conductor during a second sampling period of time ending at a second time $T_2$ within the cycle, time $T_2$ following time $T_1$ by a first predetermined time interval $\Delta T_1$, (c) third sampling means for sampling the output voltage of the column conductor during a third sampling period of time ending at a third time $T_3$ within the cycle, time $T_3$ following time $T_2$ by a second predetermined time interval, $\Delta T_2$, and (d) combining means for combining the three samples obtained by the first, second and third sampling means to produce an output voltage proportional to the change in column conductor voltage due to the charge transfer from the selected electrode in the column.

2. The device described in claim 1 wherein the first predetermined time interval $\Delta T_1$ is equal in length to the second predetermined time interval $\Delta T_2$.

3. The device described in claim 1 wherein the second predetermined time interval $\Delta T_2$ is five times the length of the first predetermined time interval $\Delta T_1$.

4. The device described in claim 2 wherein the first sampling period is contiguous in time with the second sampling period and the second sampling period is contiguous in time with the third sampling period.

* * * * *